United States Patent [19]

Rumbaugh

[11] 4,180,780

[45] Dec. 25, 1979

[54] INPUT DECOUPLING CIRCUIT FOR TRANSISTOR DIFFERENTIAL AMPLIFIER

[75] Inventor: Paul S. Rumbaugh, Garden Grove, Calif.

[73] Assignee: Altec Corporation, Anaheim, Calif.

[21] Appl. No.: 947,629

[22] Filed: Oct. 2, 1978

[51] Int. Cl.$^2$ .............................................. H03F 3/45
[52] U.S. Cl. ................................ 330/252; 330/69; 330/207 P; 330/260; 330/295; 330/298
[58] Field of Search .................. 330/69, 148, 207 P, 330/252, 260, 295, 298

[56] References Cited

U.S. PATENT DOCUMENTS 4,087,758  5/1978  Hareyama ........................ 330/69 X

FOREIGN PATENT DOCUMENTS 130611  7/1977  German Democratic Rep. .. 330/298X

*Primary Examiner*—Lawrence J. Dahl

*Attorney, Agent, or Firm*—Edward A. Sokolski

[57] ABSTRACT

A transistor amplifier circuit is arranged in a differential amplifier incorporated into a power amplifier output circuit having approximately unity voltage gain and capable of feeding high current and power outputs to a load in response to high level voltage inputs from a signal source. This same signal source may be connected to drive a plurality of different output circuits simultaneously. A decoupling diode is provided in series with the emitter of each of the transistors of the differential amplifier, these diodes having a reverse breakdown voltage which is of the order of twice the peak input voltage and the supply voltage such that in the event that a short should appear in the load or in the power amplifier being driven, the diodes will act to effectively decouple the output of the signal source from the short circuit, thereby preventing the signal source output from being loaded down and, as a result, distorted.

5 Claims, 1 Drawing Figure

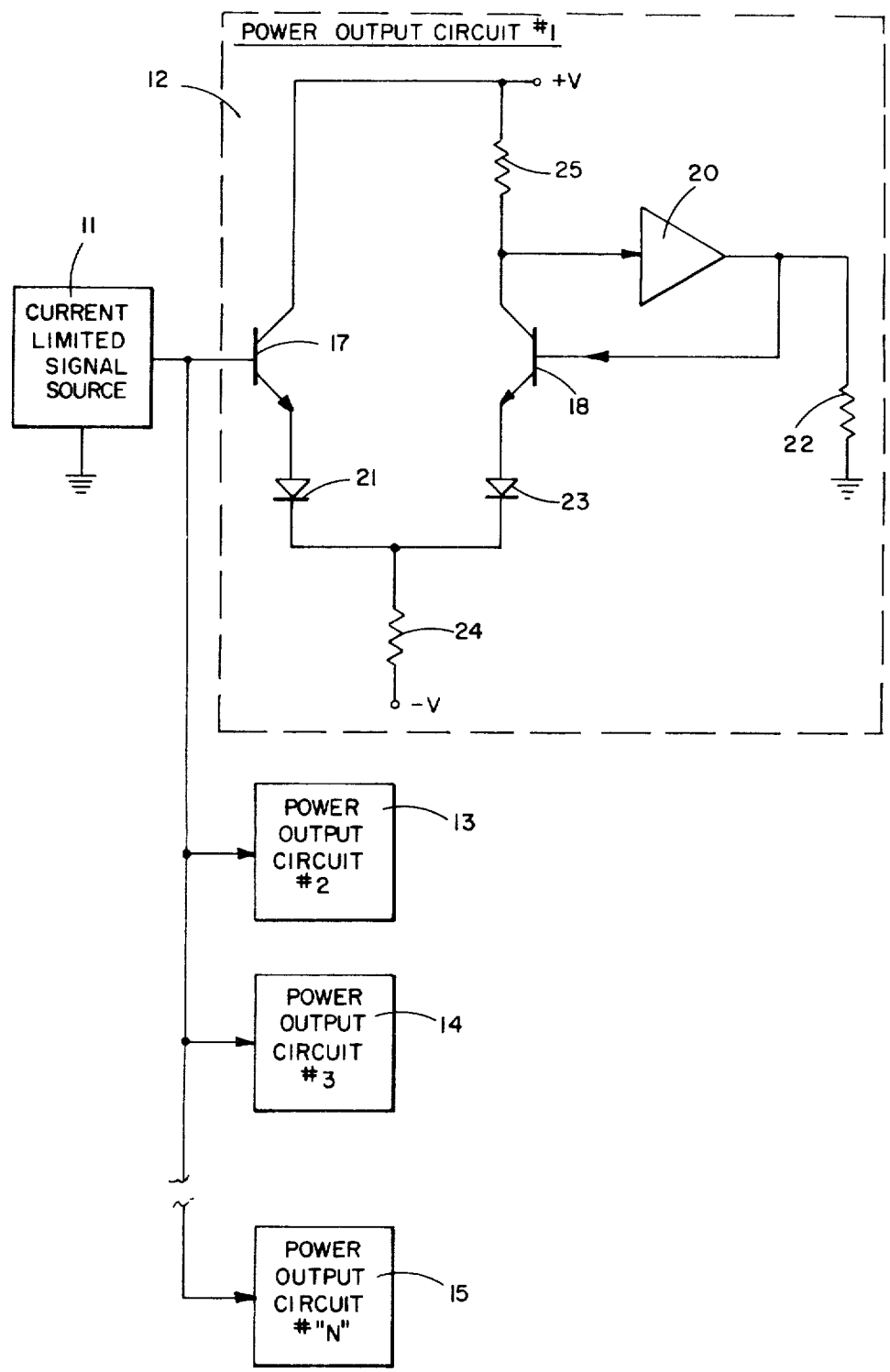

INPUT DECOUPLING CIRCUIT FOR TRANSISTOR DIFFERENTIAL AMPLIFIER

This invention relates to transistor differential amplifier circuits, and more particularly to a diode decoupling circuit for use in such a circuit to decouple the input thereto from a short circuit which may appear in the output circuit to which the differential amplifier is coupled.

In transistorized power amplifiers, such as used in high power sound systems for theater, auditorium and stadium installations, voltage follower type differential amplifiers are often used to drive the power output circuits. These differential amplifiers generally incorporate feedback circuits in conjunction with the power output circuits which enable the power amplifier to operate with substantially unity voltage gain, but high current gain. In this type of power amplifier, the input signals to the differential amplifier generally have high peak to peak voltage, while the output generally is coupled to a low impedance load such as one or more loudspeaker voice coils. In such systems, the output of a single signal source is often employed to simultaneously drive a number of separate power amplifiers, each of which has a separate output load.

It has been found that in the event that one of the loads or the power amplifier circuitry driving this load should become shorted, this short is reflected to the input of the associated differential amplifier stage and along with it to the output of the signal source. When this occurs, the output of the signal source is clamped to a relatively low voltage level having a peak to peak value, $V_{pp}$, which is as follows:

$$V_{pp} = 2(V_{eb} + V_{be}) \qquad (1)$$

where $V_{eb}$ = reverse voltage breakdown of the emitter-base junction of the transistors in the differential amplifier driving the shorted output circuit, and $V_{be}$ = forward base-emitter drop of these transistors.

Since the input voltage source is generally capable of swinging to a relative high voltage (of the order of 130 volts peak to peak), and since $V_{eb} + V_{be}$ is generally of the order of 13 volts, the output of the signal source is severely clamped in the case of a short circuit condition in any one of the output circuits, and thus is severely distorted; this distorted signal being fed to all of the otherwise normally operating amplifier units and their loads.

The present invention overcomes this shortcoming of the prior art in a simple and economical yet highly effective manner. This end result is achieved by placing a suitable diode in the emitter circuits of the differential amplifier transistors which operate to effectively decouple the input to the differential amplifiers from the shorted output circuit.

It is therefore an object of this invention to avoid distortion from arising in transistor power amplifiers having a plurality of amplifier units feeding separate output load circuits, in the event that one of these output circuits should become short circuited.

It is a further object of this invention to provide means for automatically decoupling the input of a transistor differential amplifier circuit from its output circuit should the output circuit being driven by this amplifier circuit become shorted.

Other objects of this invention will become apparent from the following description taken in connection with the accompanying drawing which is a schematic of a preferred embodiment of the invention.

Signal source 11 has an output with a relatively high peak to peak voltage swing (typically of the order of 130 volts). The output of current limited signal source 11 is fed to the base of transistor 17 of power output circuit 12, and simultaneously to a plurality of other power output circuits 13–15, which may comprise power amplifier circuits similar to circuit 12 or may comprise other types of power output circuits. Output circuit "#1", which is identified by the numeral 12, utilizes a differential pair of transistors 17 and 18. Negative feedback is provided from the output of amplifier 20 to the base of transistor 18, this negative feedback being such as to cause the output circuit 12 formed by transistors 17 and 18 and amplifier 20 to operate to provide high current amplification in the output to load 22, which typically comprises the voice coil or voice coils of one or more loudspeakers.

Connected in the emitter circuits of transistors 17 and 18 are diodes 21 and 23 respectively, the anodes of these diodes being connected to the emitters of their associated transistors, while the cathodes of the diodes are connected together to resistor 24 which in turn is connected to the negative terminal ($-V$) of the power supply. The collector of transistor 17 is connected directly to the positive terminal ($+V$) of the power supply, while the collector of transistor 18 is connected to this terminal through resistor 25. The power supply circuit preferably is a constant voltage source. Diodes 21 and 23 are chosen to have a relatively high reverse breakdown voltage (at least equal to the difference between $+V$ and $-V$). In a typical operating situation, signal source 11 might have a peak to peak output of 130 volts (between $+65$ and $-65$ volts), while the supply voltages $+V$ and $-V$ are $+65$ and $-65$ volts respectively.

Let us now observe what happens in the event a short circuit to ground should appear at the ungrounded side of load 22. During the peaks of the positive half cycles of such an input signal, the peak 65 volts will appear at the base of transistor 17. In view of the voltage drop across the emitter-base junction of transistor 17 and across diode 21 (each of the order of 0.6 volts), about $+63.8$ volts will appear between the cathode and anode of diode 23, this being substantially less than the reverse breakdown voltage of the diode. Thus, diode 23 will effectively isolate the short appearing across the load from the input signal source. During the peak of the negative half cycle of the output of signal source 11, approximately $-63.8$ volts will appear between the anode and cathode of diode 21, there being approximately a 0.6 volt drop in the emitter-base junction of transistor 18 and a 0.6 volt drop across diode 23. As this voltage is substantially below the reverse breakdown voltage of diode 21, the diode will operate to effectively isolate the output of signal source 11 from the short circuit.

In a typical operating embodiment of the invention, transistors 17 and 18 are of type MPS-A43, while diodes 21 and 23 are of type 1N3070, with signal source 11 having a peak to peak output of $+65$ to $-65$ volts, and supply source $+V = 65$ volts and $-V = 65$ volts.

Thus, the decoupling diodes act to effectively increase the reverse emitter base breakdown voltage of the input transistor from its typical value of less than 12 volts to a value greater than the breakdown voltage of the decoupling diode (of the order of 130 volts). In this manner, clamping of the signal input is effectively eliminated in situations where there is a short across load 22 to ground, a short between the ungrounded end of load 22 to the positive supply (+V), or a short between the ungrounded end of load 22 to the negative supply (−V).

While the invention has been described and illustrated in detail, it is to be clearly understood that this is intended by way of illustration and example only and is not to be taken by way of limitation, the spirit and scope of this invention being limited only by the terms of the following claims.

I claim:

1. In a power amplifier system comprising a plurality of output circuits having separate output loads and receiving their inputs from a common signal source, at least one of said output circuits including a transistor differential amplifier, the improvement being means for providing decoupling between the output of said one of said circuits and the output of said signal source to prevent a short circuit in the output of said one of said circuits from loading down the output of said signal source, comprising:

diode means connected in the emitter circuits of said one of said transistor differential amplifiers, said diode means having a reverse breakdown voltage greater in magnitude than the maximum peak to peak value of the output of said signal source.

2. The power amplifier system of claim 1 wherein said differential amplifier comprises a pair of transistors connected in a voltage follower configuration, said diode means comprising a diode connected in the emitter circuit of each of said transistors.

3. The power amplifier system of claim 1 wherein said one of said output circuits includes a negative feedback loop such that said output circuit has substantially unity voltage gain.

4. In a power amplifier system comprising a plurality of power output circuits having separate output loads and receiving their inputs from a common signal source, at least one of said circuits comprising a differential transistor amplifier connected to said signal source, said differential amplifier including a pair of transistors connected in a voltage follower configuration, the improvement being means for providing decoupling between the input of at least one of said circuits and the output thereof to prevent a short circuit in said output from loading down said signal source, comprising:

a diode connected in the emitter circuit of each of said transistors, the reverse breakdown voltage of said diodes being greater than the maximum peak to peak value of the input.

5. The system of claim 4 wherein said one of said power output circuits has substantially unity voltage gain.

* * * * *